(12) United States Patent
Lee

(10) Patent No.: US 7,384,846 B2
(45) Date of Patent: Jun. 10, 2008

(54) METHOD OF FABRICATING SEMICONDUCTOR DEVICE

(75) Inventor: Inno Lee, Icheon-si (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 150 days.

(21) Appl. No.: 11/167,221

(22) Filed: Jun. 28, 2005

(65) Prior Publication Data

US 2006/0258098 A1      Nov. 16, 2006

(30) Foreign Application Priority Data

May 12, 2005   (KR) ...................... 10-2005-0039865

(51) Int. Cl.
*H01L 21/336* (2006.01)

(52) U.S. Cl. ............... 438/258; 257/E27.132; 257/E21.664

(58) Field of Classification Search ............... 438/258, 438/424; 257/E21.548, E21.642, E21.63, 257/E21.664, E27.132
See application file for complete search history.

(56) References Cited

U.S. PATENT DOCUMENTS

| | | | | |
|---|---|---|---|---|
| 6,096,604 | A * | 8/2000 | Cha et al. ............... | 438/259 |
| 6,100,013 | A * | 8/2000 | Brown et al. ............ | 430/312 |
| 6,268,265 | B1 * | 7/2001 | Hwang et al. ........... | 438/424 |
| 6,338,993 | B1 * | 1/2002 | Lien ........................ | 438/238 |
| 6,372,564 | B1 * | 4/2002 | Lee .......................... | 438/192 |
| 6,743,695 | B2 | 6/2004 | Lee et al. | |
| 6,790,728 | B1 * | 9/2004 | Dong et al. .............. | 438/257 |
| 6,818,383 | B2 * | 11/2004 | Kawai ..................... | 430/311 |
| 6,835,662 | B1 * | 12/2004 | Erhardt et al. ........... | 438/689 |
| 6,849,519 | B2 * | 2/2005 | Dong ...................... | 438/424 |
| 6,887,767 | B2 * | 5/2005 | Nakasato et al. ........ | 438/426 |
| 6,933,236 | B2 * | 8/2005 | Lee et al. ................. | 438/695 |
| 7,071,527 | B2 * | 7/2006 | Iwabuchi ................. | 257/492 |
| 7,183,174 | B2 * | 2/2007 | Park ......................... | 438/424 |
| 7,235,460 | B2 * | 6/2007 | Li ............................ | 438/447 |
| 2006/0290429 | A1 * | 12/2006 | Kishioka et al. ......... | 330/292 |

FOREIGN PATENT DOCUMENTS

| | | |
|---|---|---|
| JP | 2000-269466 | 9/2000 |
| KR | 1020030002870 | 1/2003 |
| KR | 1020040013363 | 2/2004 |
| KR | 1020040032531 | 4/2004 |
| KR | 1020040050967 | 6/2004 |
| KR | 1020050029431 | 3/2005 |
| KR | 1020050037653 | 4/2005 |

OTHER PUBLICATIONS

Notice of Allowance for Korean App. 2005-39865.
Official Action for Chinese patent app. 2005100897380.

* cited by examiner

*Primary Examiner*—Michael S. Lebentritt
*Assistant Examiner*—Thu-Huong Dinh
(74) *Attorney, Agent, or Firm*—Lowe Hauptman Ham & Berner LLP

(57) ABSTRACT

A method of fabricating semiconductor devices. Upon formation of a trench for isolation in a cell region, a hard mask film is used as an etch mask. It is thus possible to prevent attacks of a lower layer due to deformation or loss of the etch mask.

25 Claims, 6 Drawing Sheets

METHOD OF FABRICATING SEMICONDUCTOR DEVICE

BACKGROUND

1. Field of the Invention

The present invention relates to a method of fabricating semiconductor devices. More specifically, the present invention relates to a method of fabricating semiconductor devices, wherein a lower layer is prevented from being attacked due to deformation and loss of an etch mask when forming a trench for isolation in a cell region.

2. Discussion of Related Art

Generally, a semiconductor device includes an isolation region for electrically separating individual circuit patterns. More particularly, as semiconductor devices are high integrated and miniaturized, development into the shrinkage of an isolation region as well as the shrinkage of the size of an individual element is actively in progress. This is because formation of the isolation region greatly influences the size of an active region and process margin of subsequent process steps, as an initial manufacturing step of all semiconductor devices.

Recently, a LOCOS isolation method that has been widely used in fabrication of semiconductor devices forms an isolation region having a relatively wide area, and reaches a limit as semiconductor devices are highly integrated. Accordingly, a trench isolation method in which some of a substrate is etched to form trenches, thereby isolating elements has been proposed as technology suitable for isolation of high-integrated semiconductor devices.

Meanwhile, among semiconductor devices, flash memory devices in which stored information is not erased although external power is off have been spotlighted and widely used in memory cards. The flash memory devices need a high voltage in program and erase operations. Accordingly, a semiconductor substrate of a flash memory device has characteristics in that it has to include a peripheral region in which a high voltage circuit will be formed as well as a cell region in which data will be stored, wherein the peripheral region has to be wider than the cell region, and an isolation film of the peripheral region has to be greater than a width and depth of the isolation film of the cell region. In order to fulfill the characteristics of this flash memory device, a dual trench isolation structure in which an isolation film of the peripheral region is deeper than an isolation film of the cell region has been proposed.

As such, in order to form isolation films having different depths in the cell region and the peripheral region, respectively, a photomask process and an etch process have to be performed on each of the cell region and the peripheral region. The peripheral region has to use a photoresist for KrF since it has a great pattern size. The cell region has to use a photoresist for ArF, which can be patterned finely, since it has a small pattern size.

The photoresist for KrF, which uses KrF light (248 nm) as an exposure light, does not become problematic upon etching of trenches because it is not weak in plasma and can be formed thickly. However, the photoresist for ArF, which uses ArF light (193 nm) as exposure light, can be lost upon etching of trenches because it is thin in thickness and weak in plasma. Further, the photoresist for ArF can be deformed due to plasma used in a trench etching process, and thus attacks a lower layer and a semiconductor substrate.

More particularly, in nano technologies, as overlay margin between a floating gate and an isolation film decreases, a pad nitride film, which serves as an anti-polish film in a subsequent CMP process of a polysilicon film, is lost in the case of introducing a self-aligned floating gate (SAFG) scheme. Accordingly, a thickness of the pad nitride film is increased about 1000 to 2000 Å. This makes it impossible to etch trenches using a photoresist for ArF.

SUMMARY OF THE INVENTION

Accordingly, the present invention has been made in view of the above problems, and it is an object of the present invention to provide a method of fabricating semiconductor devices, in which deformation and loss of a photoresist upon etching of a trench for isolation in a cell region can be prevented.

Another object of the present invention is to provide a method of fabricating semiconductor devices, wherein attack of a lower layer upon etching of a trench for isolation in a cell region can be prevented.

Further, another object of the present invention is to provide a method of fabricating semiconductor devices, wherein generation of defective patterns upon etching of a trench for isolation in a cell region can be prevented, thus increasing the yield.

To achieve the above objects, according to an aspect of the present invention, there is provided a method of fabricating a semiconductor device, including stacking a buffer film, an anti-polish film and a hard mask film on a semiconductor substrate including a cell region, patterning the hard mask film to define an isolation region of the cell region, etching the anti-polish film and the buffer film using the patterned hard mask film as a mask, etching the semiconductor substrate using the patterned hard mask film as a mask, forming a plurality of trenches, and forming isolation films within the trenches.

According to another aspect of the present invention, there is provided a method of fabricating a semiconductor device, including stacking a buffer film, an anti-polish film, a gate oxide film, a gate electrode film and a hard mask film on a semiconductor substrate including a cell region, patterning the hard mask film to define an isolation region of the cell region, etching the gate electrode film, the gate oxide film, the anti-polish film and the buffer film using the patterned hard mask film as a mask, etching the semiconductor substrate using the patterned hard mask film as a mask, forming a plurality of trenches, and forming isolation films within the trenches.

DETAILED DESCRIPTION OF PREFERRED EMBODIMENTS

Embodiments according to the present invention will be described with reference to the accompanying drawings. Since the embodiments are provided so that a person of ordinary skill in the art will be able to understand the present invention, the embodiments may be modified in various manners and the scope of the present invention is not limited by the embodiments described herein.

FIGS. 1A to 1E are cross-sectional views for explaining a method of fabricating semiconductor devices according to an embodiment of the present invention.

Figure 1A:
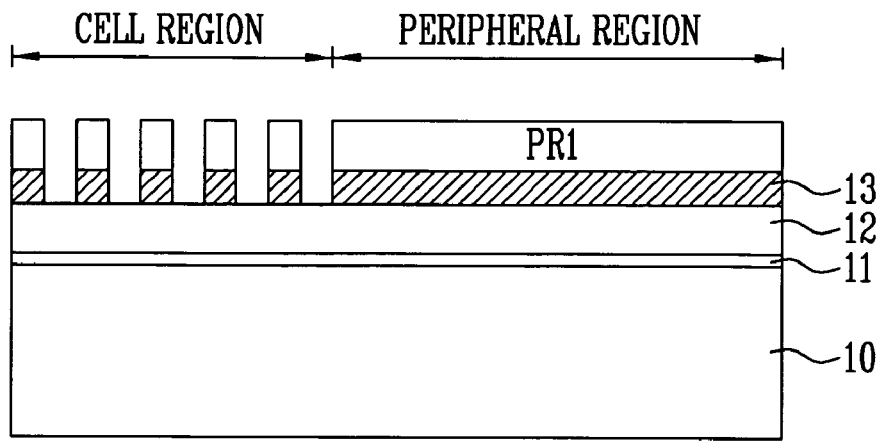
FIGS. 1A to 1E are cross-sectional views for explaining a method of fabricating semiconductor devices according to an embodiment of the present invention.

In the method of fabricating the semiconductor devices according to a first embodiment of the present invention, as shown in FIG. 1A, an anti-polish film 12, which can serve as an anti-polish film in subsequent CMP, is formed on a semiconductor substrate 10 including a peripheral region in which a high voltage circuit will be formed as well as a cell region. The anti-polish film 12 preferably uses a silicon nitride film in performing an anti-polish role. Further, a buffer film 11 capable of mitigating a difference in stress can be formed between the semiconductor substrate 10 and the anti-polish film 12.

A hard mask film 13 is then formed on the anti-polish film 12, and a first photoresist PR1 is coated on the hard mask film 13. The hard mask film 13 can use one of an oxide film, an oxynitride film, a nitride film and a polysilicon film.

The first photoresist PR1 is for defining an isolation region in the cell region, and uses a photoresist for ArF, which allows for a fine pattern.

The first photoresist PR1 is patterned using an exposure and development process to define the isolation region of the cell region. The hard mask film 13 is selectively etched by means of a plasma etch process using the first photoresist PR1 as a mask.

The plasma etch process can use one of RIE (Reactive Ion Etching), MERIE (Magnetron Enhanced Reactive Ion Etching), ICP (Inductively Coupled Plasma) and helicon. At this time, an etch gas can use HBr, $NF_3$, $Cl_2$, $N_2$, $BCl_3$, $C_2F_6$, $CHF_3$, $CF_4$, $C_4F_6$, $C_5F_6$, $C_4F_8$ or the like.

Figure 1B:
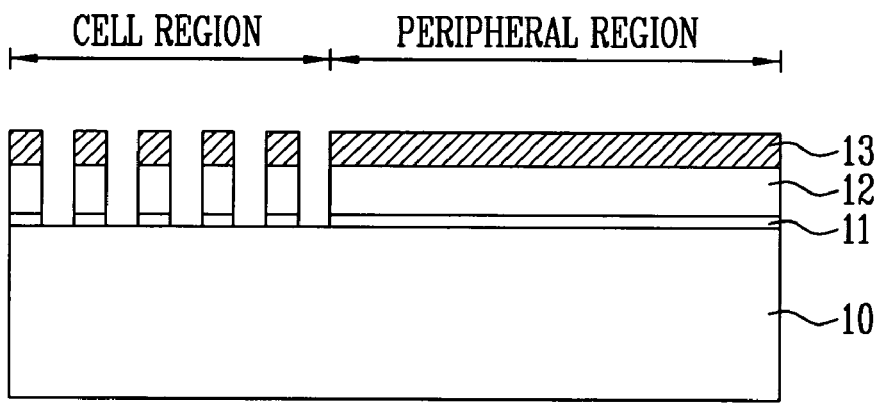

Referring next to FIG. 1B, the first photoresist PR1 is removed, and the anti-polish film 12 and the buffer film 11 are then etched using the selectively etched hard mask film 13 as a mask, thus exposing the semiconductor substrate 10 of the cell region.

Figure 1C:
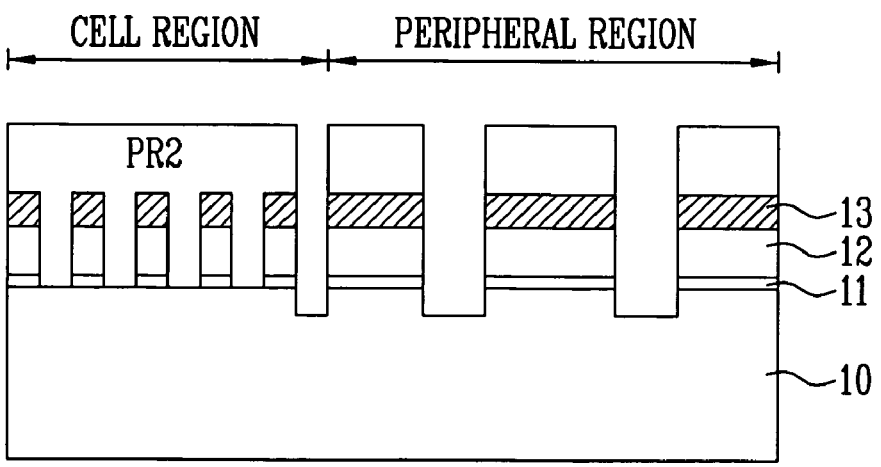

As shown in FIG. 1C, a second photoresist PR2 is coated on the entire surface.

The second photoresist PR2 is for defining an isolation region in the peripheral region, and uses a photoresist for KrF.

The photoresist for ArF allows for fine patterning but can be formed thinly, whereas the photoresist for KrF does not allows to fine patterning but can be formed thickly.

Therefore, the second photoresist PR2 is formed to be thicker than the first photoresist PR1.

The second photoresist PR2 is then patterned by means of an exposure and development process so that the isolation region of the peripheral region is defined. The hard mask film 13 and the anti-polish film 12 and the buffer film 11 are etched using the patterned second photoresist PR2 as a mask.

At this time, the second photoresist PR2 is not lost and deformed in the etch process because it can be formed thickly and is not weak in plasma unlike the first photoresist PR1.

In the case where depths of trenches of the cell region and the peripheral region are set to be different, i.e., a dual trench structure is to be formed, the semiconductor substrate 10 below the buffer film 11 is additionally etched to a predetermined depth in an etch process using the second photoresist PR2 as a mask, as shown in FIG. 1C. The predetermined depth corresponds to a difference in depths of trenches in the cell region and the peripheral region.

Figure 1D:
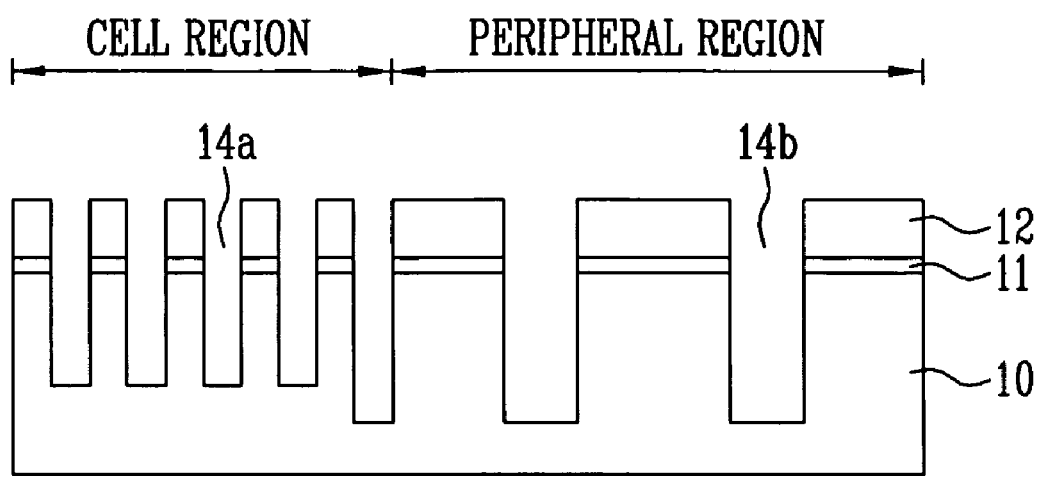

Thereafter, the second photoresist PR2 is stripped. As shown in FIG. 1D, the semiconductor substrate 10 is etched by means of a plasma etch process using the hard mask films 13 of the cell region and the peripheral region as a mask, thereby forming trenches 14a and 14b in the cell region and the peripheral region.

The plasma etch process can use one of RIE, MERIE, ICP and helicon. At this time, an etch gas can use HBr, $NF_3$, $Cl_2$, $N_2$, $BCl_3$, $C_2F_6$, $CHF_3$, $CF_4$, $C_4F_6$, $C_5F_6$, $C_4F_8$ or the like.

Meanwhile, in order to obtain top round characteristics of the trenches 14a and 14b, an ICP type plasma etch process among plasma etch processes can be used. In the ICP type plasma etch process, source power of an ICP type etch apparatus is set to 0 to 5000 [W] and bias power thereof is set to 0 to 2000 [W]. An etch gas uses $CF_4$, $CHF_4$, Ar, HBr, $O_2$ or the like.

If the semiconductor substrate 10 is not etched in an etch process using the second photoresist PR2 as a mask, a depth of the trench 14a in the cell region and a depth of the trench 14b in the peripheral region have the same single trench structure. On the other hand, if the semiconductor substrate 10 is etched to a predetermined depth in an etch process using the second photoresist PR2 as a mask, a depth of the trench 14b in the peripheral region have a dual trench structure deeper than a depth of the trench 14a in the cell region.

Further, the hard mask film 13 is removed when the trenches 14a ad14b are etched, and thus needs not to be removed through additional process.

Figure 1E:
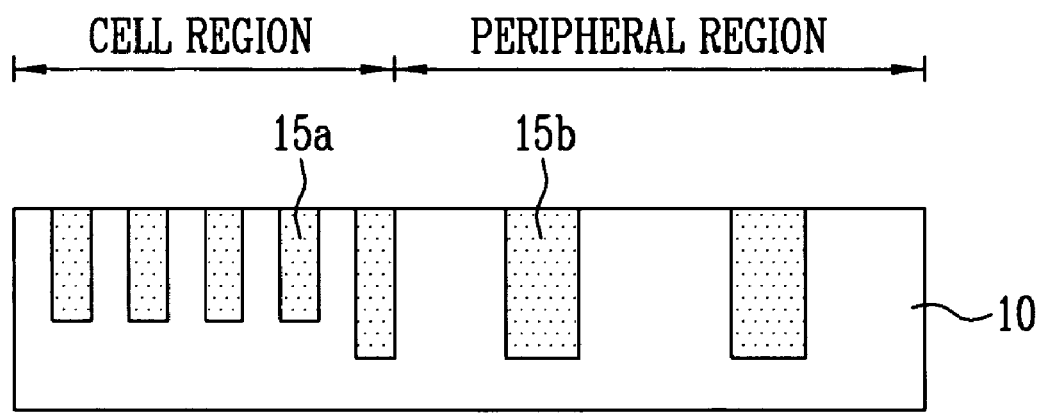

Referring next to FIG. 1E, after the anti-polish film 12 and the buffer film 11 are removed by means of a wet etch process, an insulating film is deposited on the entire surface so that the trenches 14a and 14b are completely buried. The insulating film is then polished by means of a CMP process so that the semiconductor substrate 10 is exposed, thereby forming isolation films 15a and 15b within the trenches 14a and 14b.

Though not shown in the drawings, a tunnel oxide film and a polysilicon film for floating gate are formed on the semiconductor substrate, and the polysilicon film for floating gate is selectively patterned by means of a photolithography and etch process, thus forming the floating gate. Thereby, fabrication of the semiconductor device according to the above embodiment of the present invention is completed.

The first embodiment corresponds to a case where the present invention is applied to a conventional shallow trench isolation (STI) process in which an isolation film is formed, and a tunnel oxide film and a floating gate are then formed. It is however to be noted that the present invention can be applied to a STI process and a SAFG process as well as the conventional STI process. This will be described in detail in connection with the below embodiments with reference to the accompanying drawings.

FIGS. 2A to 2E are cross-sectional views for explaining a method of fabricating semiconductor devices according to another embodiment of the present invention. FIGS. 2A to 2E show an embodiment where the present invention is applied to a STI process.

Figure 2A:
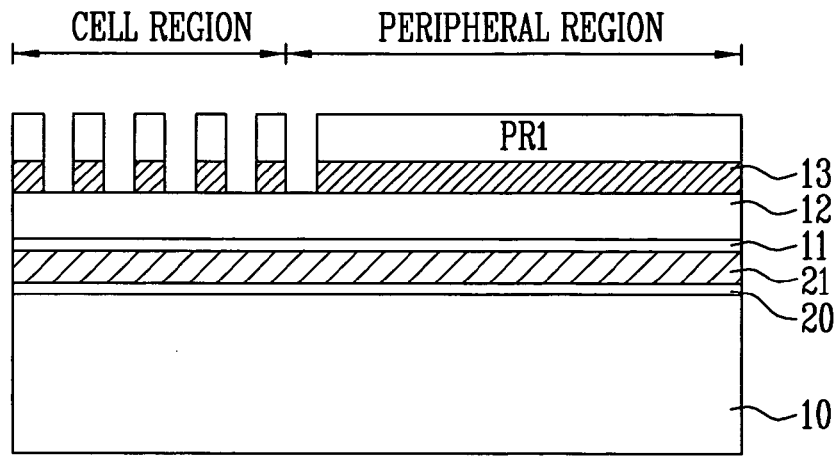
FIGS. 2A to 2E are cross-sectional views for explaining a method of fabricating semiconductor devices according to another embodiment of the present invention.

In fabrication of the semiconductor device according to this embodiment of the present invention, a tunnel oxide film 20 and a floating gate 21 are first sequentially formed on a semiconductor substrate 10, as shown in FIG. 2A. At this time, the tunnel oxide film 20 is formed by oxidizing the semiconductor substrate 10 made of silicon, etc., and the floating gate 21 is formed of a conductive material such as polysilicon.

An anti-polish film 12, which can serve as an anti-polish film in subsequent CMP, is formed on the floating gate 21. Further, a buffer film 11 capable of mitigating a difference in stress can be formed between the floating gate 21 and the anti-polish film 12.

A hard mask film 13, which will be used as an etch mask in forming a trench in a cell region, is then formed on the anti-polish film 12, and a first photoresist PR1 is coated on the hard mask film 13.

The hard mask film 13 can use one of an oxide film, an oxynitride film, a nitride film and a polysilicon film.

The first photoresist PR1 is for defining an isolation region in the cell region, and uses a photoresist for ArF, which allows for a fine pattern.

The first photoresist PR1 is patterned using an exposure and development process to define the isolation region of the cell region. The hard mask film 13 is selectively etched by means of a plasma etch process using the first photoresist PR1 as a mask.

The plasma etch process can use one of RIE (Reactive Ion Etching), MERIE (Magnetron Enhanced Reactive Ion Etching), ICP (Inductively Coupled Plasma) and helicon. Exemplary etch gases may include HBr, $NF_3$, $Cl_2$, $N_2$, $BCl_3$, $C_2F_6$, $CHF_3$, $CF_4$, $C_4F_6$, $C_5F_6$, $C_4F_8$ or the like.

Figure 2B:
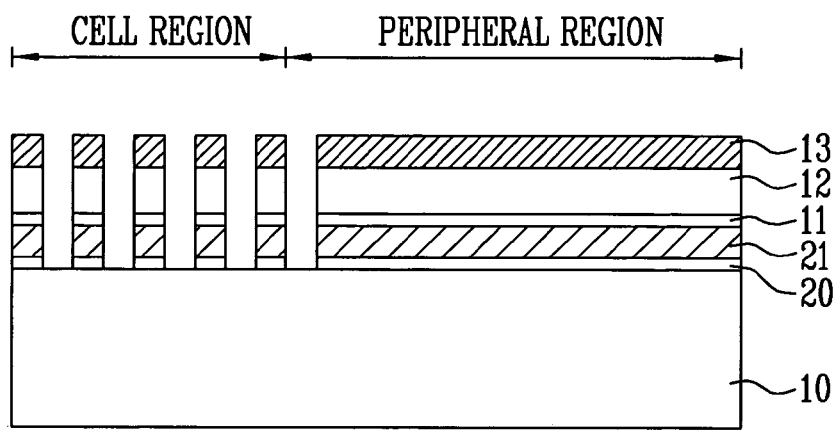

As shown in FIG. 2B, the first photoresist PR1 is removed. The anti-polish film 12, the buffer film 11, the floating gate 21 and the tunnel oxide film 20 in the cell region are then etched using the patterned hard mask film 13 as a mask.

Figure 2C:
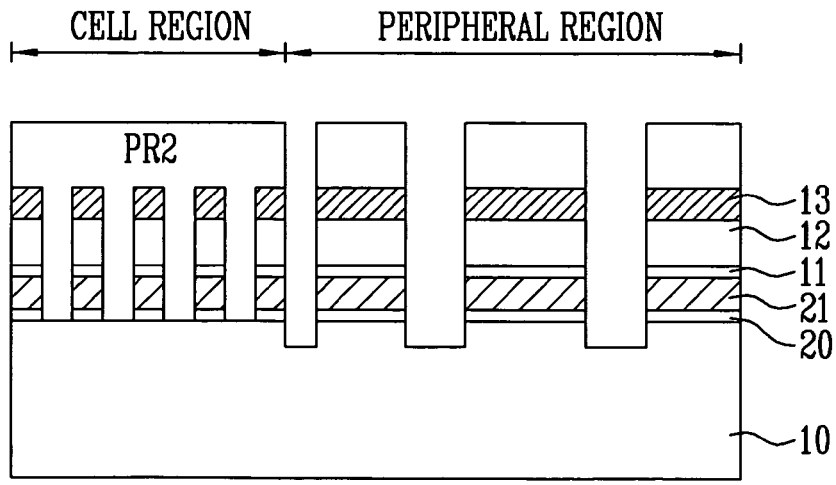

As shown in FIG. 2C, a second photoresist PR2 is coated on the entire surface. The second photoresist PR2 is patterned by means of an exposure and development process so that an isolation region of a peripheral region is defined.

The second photoresist PR2 is for defining the isolation region in the peripheral region, and uses a photoresist for KrF. Accordingly, the second photoresist PR2 can be formed to be thicker than the first photoresist PR1.

Thereafter, the hard mask film 13, the anti-polish film 12, the buffer film 11, the floating gate 21 and the tunnel oxide film 20 are etched using the patterned second photoresist PR2 as a mask.

The second photoresist PR2 is not lost and deformed in the etch process because it can be formed thickly and is not weak in plasma unlike the first photoresist PR1.

In the case where depths of trenches of the cell region and the peripheral region are set to be different, i.e., a dual trench structure is to be formed, the semiconductor substrate 10 below the buffer film 11 is additionally etched to a predetermined depth in an etch process using the second photoresist PR2 as a mask, as shown in FIG. 2C. The predetermined depth corresponds to a difference in depths of trenches in the cell region and the peripheral region.

Figure 2D:
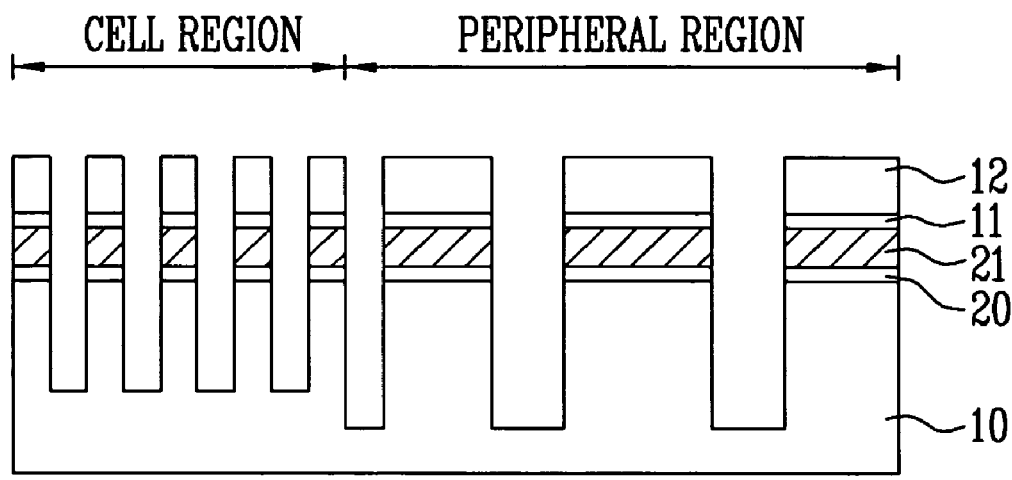

As shown in FIG. 2D, the second photoresist PR2 is stripped. The semiconductor substrate 10 is etched by means of a plasma etch process using the hard mask films 13 of the cell region and the peripheral region as a mask, thereby forming trenches 14a and 14b in the cell region and the peripheral region.

The plasma etch process can use one of RIE, MERIE, ICP and helicon. Exemplary etch gases may include HBr, $NF_3$, $Cl_2$, $N_2$, $BCl_3$, $C_2F_6$, $CHF_3$, $CF_4$, $C_4F_6$, $C_5F_6$, $C_4F_8$ or the like.

In order to obtain top round characteristics of the trenches 14a and 14b, an ICP type plasma etch process among plasma etch processes can be used. In the ICP type plasma etch process, source power of an ICP type etch apparatus is set to 0 to 5000 [W] and bias power thereof is set to 0 to 2000 [W]. An etch gas may use $CF_4$, $CHF_3$, Ar, HBr, $O_2$ or the like.

If the semiconductor substrate 10 of the peripheral region is etched to a predetermined depth in an etch process using the second photoresist PR2 as a mask, a depth of the trench 14b in the peripheral region have a dual trench structure deeper than a depth of the trench 14a in the cell region. However, if the semiconductor substrate 10 of the peripheral region is not etched in an etch process using the second photoresist PR2 as a mask, a depth of the trench 14a in the cell region and a depth of the trench 14b in the peripheral region have the same single trench structure.

Meanwhile, the hard mask film 13 is removed when the trenches 14a ad14b are etched, and thus needs not to be removed through additional process.

Figure 2E:
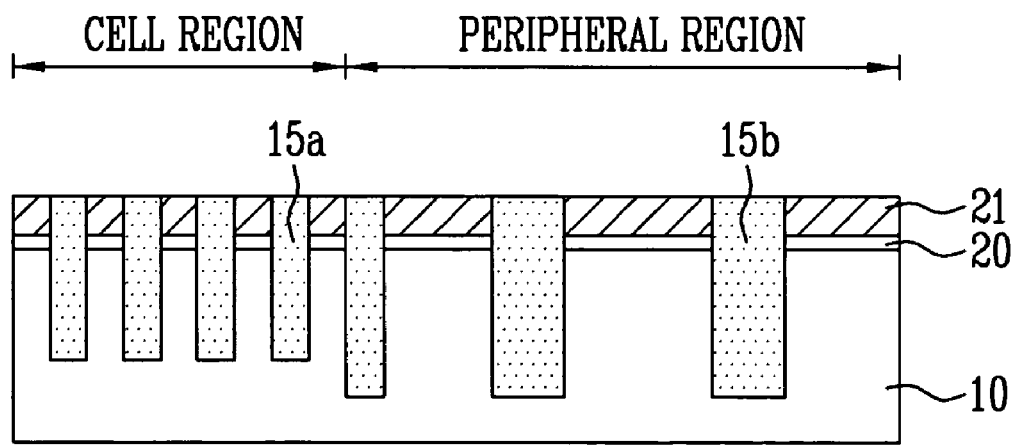

As shown in FIG. 2E, an insulating film is deposited on the entire surface so that the trenches are fully buried. The insulating film is polished by means of a CMP process so that the anti-polish film 12 is exposed, thereby forming isolation films 15a and 15b within the trenches 14a and 14b. The anti-polish film 12 and the buffer film 11 are then removed by means of a wet etch process.

Fabrication of the semiconductor device according to this embodiment of the present invention is thereby completed.

A method of fabricating a semiconductor device according to yet another embodiment of the present invention will now be described with reference to FIGS. 3A to 3E.

FIGS. 3A to 3E are cross-sectional views for explaining a method of fabricating semiconductor devices according to yet another embodiment of the present invention. FIGS. 3A to 3E show a case where the preset invention is applied to a SAFG process.

Figure 3A:
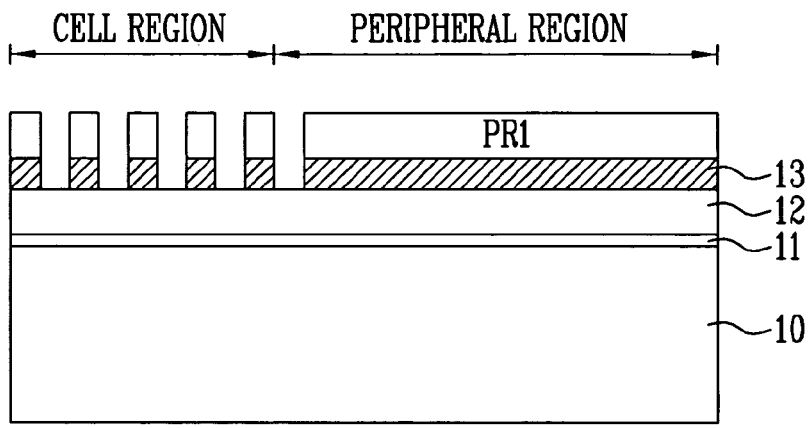
FIGS. 3A to 3E are cross-sectional views for explaining a method of fabricating semiconductor devices according to yet another embodiment of the present invention.

In fabrication of the semiconductor device according to a third embodiment of the present invention, as shown in FIG. 3A, an anti-polish film 12, which can serve as an anti-polish film in subsequent CMP, is formed on a semiconductor substrate 10. Further, a buffer film 11 capable of mitigating a difference in stress that can be generated between the semiconductor substrate 10 and the anti-polish film 12, can be formed between the semiconductor substrate 10 and the anti-polish film 12.

A hard mask film 13, which will be used as an etch mask in forming a trench in a cell region, is then formed on the anti-polish film 12, and a first photoresist PR1 is coated on the hard mask film 13.

The hard mask film 13 can use one of an oxide film, an oxynitride film, a nitride film and a polysilicon film.

The first photoresist PR1 is for defining an isolation region in the cell region, and uses a photoresist for ArF, which allows for a fine pattern.

The first photoresist PR1 is patterned using an exposure and development process to define the isolation region of the cell region. The hard mask film 13 is selectively etched by means of a plasma etch process using the first photoresist PR1 as a mask.

The plasma etch process can use one of RIE (Reactive Ion Etching), MERIE (Magnetron Enhanced Reactive Ion Etching), ICP (Inductively Coupled Plasma) and helicon. Exemplary etch gases may include HBr, $NF_3$, $Cl_2$, $N_2$, $BCl_3$, $C_2F_6$, $CHF_3$, $CF_4$, $C_4F_6$, $C_5F_6$, $C_4F_8$ or the like.

Figure 3B:
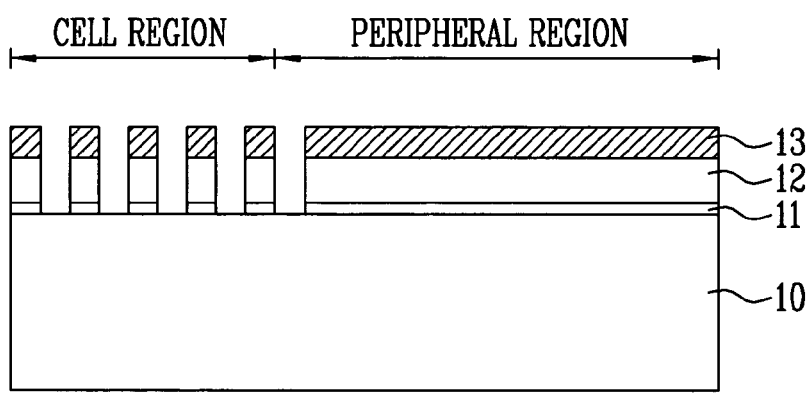

As shown in FIG. 3B, the first photoresist PR1 is removed. The anti-polish film 12 and the buffer film 11 in the cell region are then etched using the patterned hard mask film 13 as a mask.

Figure 3C:
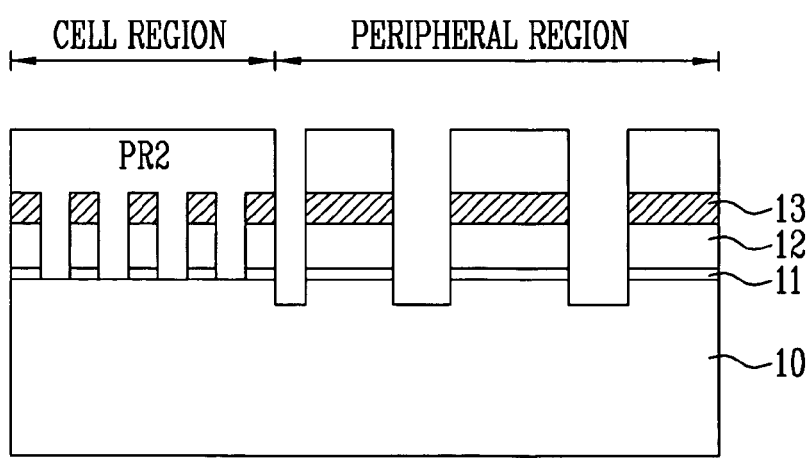

As shown in FIG. 3C, a second photoresist PR2 is coated on the entire surface. The second photoresist PR2 is patterned by means of an exposure and development process so that an isolation region of a peripheral region is defined.

The second photoresist PR2 is for defining the isolation region in the peripheral region, and uses a photoresist for KrF. Accordingly, the second photoresist PR2 can be formed to be thicker than the first photoresist PR1.

Thereafter, the hard mask film 13, the anti-polish film 12 and the buffer film 11 are etched using the patterned second photoresist PR2 as a mask.

The second photoresist PR2 is not lost and deformed in the etch process because it can be formed thickly and is not weak in plasma unlike the first photoresist PR1.

In embodiments where depths of trenches of the cell region and the peripheral region are set to be different, i.e., a dual trench structure is to be formed, the semiconductor substrate 10 below the buffer film 11 is additionally etched to a predetermined depth in an etch process using the second photoresist PR2 as a mask, as shown in the drawing. The predetermined depth corresponds to a difference in depths of trenches in the cell region and the peripheral region.

Figure 3D:
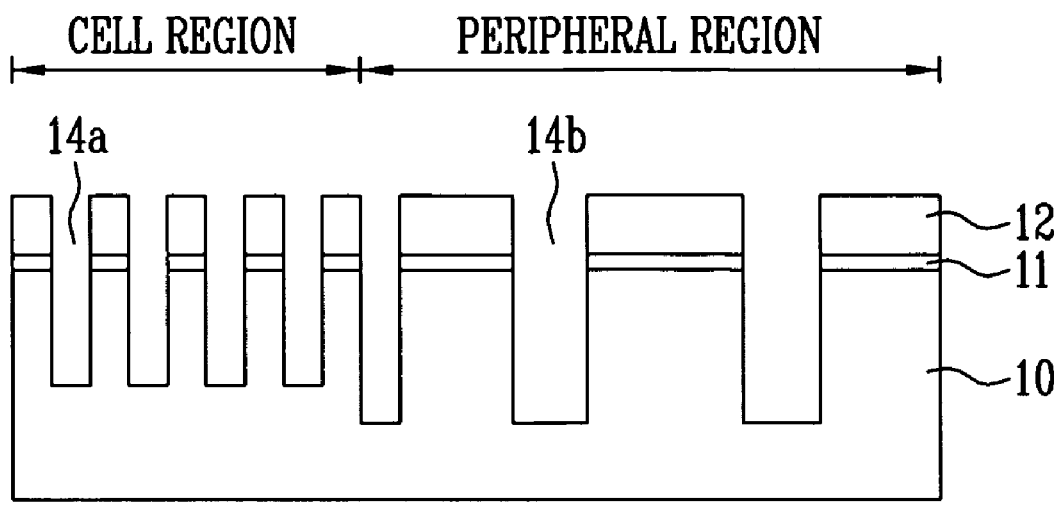

As shown in FIG. 3D, the second photoresist PR2 is stripped. the semiconductor substrate 10 is etched by means of a plasma etch process using the hard mask films 13 of the cell region and the peripheral region as a mask, thereby forming trenches 14a and 14b in the cell region and the peripheral region.

The plasma etch process can use one of RIE, MERIE, ICP and helicon, and exemplary etch gases may include HBr, $NF_3$, $Cl_2$, $N_2$, $BCl_3$, $C_2F_6$, $CHF_3$, $CF_4$, $C_4F_6$, $C_5F_6$, $C_4F_8$ or the like.

In order to obtain top round characteristics of the trenches 14a and 14b, an ICP type plasma etch process among plasma etch processes can be used. In the ICP type plasma etch process, source power of an ICP type etch apparatus is set to 0 to 5000 [W] and bias power thereof is set to 0 to 2000 [W]. An etch gas may use $CF_4$, $CHF_4$, Ar, HBr, $O_2$ or the like.

If the semiconductor substrate 10 of the peripheral region is etched to a predetermined depth in an etch process using the second photoresist PR2 as a mask, a depth of the trench 14b in the peripheral region have a dual trench structure deeper than a depth of the trench 14a in the cell region. However, if the semiconductor substrate 10 of the peripheral region is not etched in an etch process using the second photoresist PR2 as a mask, a depth of the trench 14a in the cell region and a depth of the trench 14b in the peripheral region have the same single trench structure.

The hard mask film 13 is removed when the trenches 14a ad14b are etched, and thus does not need to be removed through additional process.

Figure 3E:
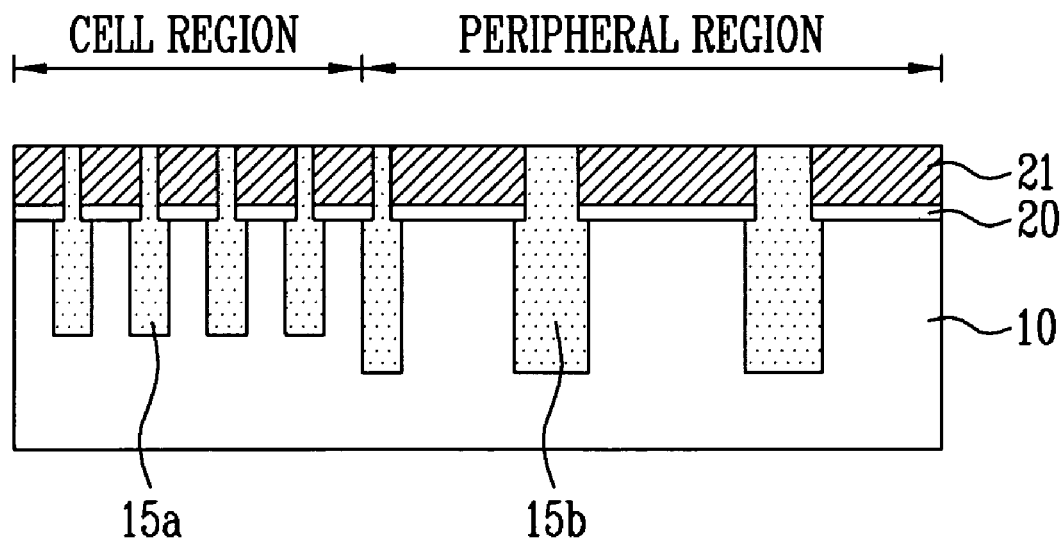

As shown in FIG. 3E, an insulating film is deposited on the entire surface so that the trenches are fully buried. The insulating film is polished by means of a CMP process so that the anti-polish film 12 is exposed, thereby forming isolation films 15a and 15b within the trenches 14a and 14b. The anti-polish film 12 and the buffer film 11 are then removed by means of a wet etch process.

Thereafter, the anti-polish film 12 and the buffer film 11 are removed by means of a wet etch process, thus exposing the semiconductor substrate 10 of the active region. At this time, a surface of the isolation films 15a and 15b on a surface of the semiconductor substrate 10 is also recessed to a predetermined depth, thereby securing a space where a floating gate will be formed.

A tunnel oxide film 20 is then formed on the semiconductor substrate 10 of the exposed active region. After a polysilicon film is deposited on the entire surface, it is polished and the floating gate 21 is deposited so that the 20 floating gate 21 is even with the isolation film 15a and 15b, thus forming a floating gate 21.

Fabrication of the semiconductor device according to this embodiment of the present invention is thereby completed.

It has been described in the aforementioned embodiments that the present invention is applied to flash memory devices. It is, however, to be understood that the present invention can be applied to all semiconductor devices having an isolation film of the STI structure.

Furthermore, it has been described that the aforementioned embodiments are applied to the single trench structure and the dual trench structure. It is, however, to be noted that the present invention can be applied to a multi-trench structure consisting of a dual trench or three or more trenches having different depths.

As described above, according to the present invention, a hard mask is used as a mask for forming trenches for isolation in a cell region. Therefore, the present invention has an effect in that attach of a lower layer upon etching of trenches can be prevented.

Further, since attach of a lower layer upon etching of trenches can be prevented, the reliability and the yield of devices can be improved.

Although the foregoing description has been made with reference to the above embodiments, it is to be understood that the changes and modifications of the present invention may be made by a person of ordinary skill in the art without departing from the spirit and scope of the present invention and appended claims.

What is claimed is:

1. A method of fabricating a semiconductor device, comprising the steps of:
   (a) stacking a buffer film, an anti-polish film and a hard mask film on a semiconductor substrate including a cell region;
   (b) coating a first photoresist on the entire surface, then patterning the first photoresist to define the isolation region of the cell region, and then patterning the hard mask film using the patterned first photoresist as a mask;
   (c) etching the anti-polish film and the buffer film using a patterned hard mask film as a mask;
   (d) forming a second photoresist on the entire surface including the cell region and a peripheral region other than the cell region;
   (e) patterning the second photoresist to define an isolation region of the peripheral region;
   (f) etching the hard mask film, the anti-polish film and the buffer film using the patterned second photoresist as a mask;
   (g) etching the semiconductor substrate using the patterned hard mask film as a mask, forming a plurality of trenches; and
   (h) forming isolation films within the trenches.

2. The method as claimed in claim 1, wherein the first photoresist is a photoresist for ArF that uses an ArF light source as an exposure light source.

3. The method as claimed in claim 1, wherein upon patterning of the hard mask film in the patterning step (b), a plasma etch process is employed.

4. The method as claimed in claim 3, wherein in the plasma etching process, HBr, $NF_3$, $Cl_2$, $N_2$, $BCl_3$, $C_2F_6$, $CHF_3$, $CF_4$, $C_4F_6$, $C_5F_6$ or $C_4F_8$ is used as an etch gas.

5. The method as claimed in claim 1, wherein the hard mask film uses one of an oxide film, an oxynitride film, a nitride film and a polysilicon film.

6. The method as claimed in claim 1, wherein the second photoresist is a photoresist for KrF that uses a KrF light source as an exposure light source.

7. The method as claimed in claim 1, wherein in the etch process of the step (f), the semiconductor substrate below the buffer film is additionally etched to a predetermined depth.

8. The method as claimed in claim 1, wherein upon etching of the semiconductor substrate in the step (g), a plasma etch process is employed.

9. The method as claimed in claim 8 wherein in the plasma etching process, HBr, NF3, Cl2, N2, BCl3, C2F6, CHF3, CF4, C4F6, C5F6 or C4F8 is used as an etch gas.

10. The method as claimed in claim 8, wherein the plasma etch process employs an ICP (Inductively Coupled Plasma) type plasma etch process.

11. The method as claimed in claim 10, wherein in the ICP type plasma etch process, source power is set to 0 to 500 [W], bias power is set to 0 to 2000 [W], and an etch gas employs at least one $CF_4$, $CHF_3$, Ar, HBr or $O_2$.

12. The method as claimed in claim 1, further comprising:
removing the anti-polish film and the buffer film before the step (h) is performed after the step (g); and
forming a gate oxide film and a gate electrode on a predetermined region of the semiconductor substrate after the step (h).

13. A method of fabricating a semiconductor device, comprising the steps of:
(a) stacking a buffer film, an anti-polish film and a hard mask film on a semiconductor substrate including a cell region;
(b) coating a first photoresist on the entire surface, then patterning the first photoresist to define the isolation region of the cell region, and then patterning the hard mask film using the patterned first photoresist as a mask;
(c) etching the anti-polish film and the buffer film using a patterned hard mask film as a mask;
(d) forming a second photoresist on the entire surface including the cell region and a peripheral region other than the cell region;
(e) patterning the second photoresist to define an isolation region of the peripheral region;
(f) etching the hard mask film, the anti-polish film and the buffer film using the patterned second photoresist as a mask;
(g) etching the semiconductor substrate using the patterned hard mask film as a mask, forming a plurality of trenches;
(h) forming isolation films within the trenches;
(i) removing the anti-polish film and the buffer film;
(j) forming a gate oxide film on the semiconductor substrate, which is exposed through the removal of the buffer film and the anti-polish film; and
(k) depositing an electrode film on the entire surface, and polishing the electrode film so that the isolation film is exposed, thus forming a gate electrode.

14. A method of fabricating a semiconductor device, comprising:
(i) stacking a buffer film, an anti-polish film, a gate oxide film, a gate electrode film and a hard mask film on a semiconductor substrate including a cell region;
(ii) coating a first photoresist on the entire surface, then patterning the first photoresist to define the isolation region of the cell region, and then patterning the hard mask film using a patterned first photoresist as a mask;
(iii) etching the gate electrode film, the gate oxide film, the anti-polish film and the buffer film using the patterned hard mask film as a mask;
(iv) forming a second photoresist on the entire surface including the cell region and a peripheral region other than the cell region;
(v) patterning the second photoresist to define an isolation region of the peripheral region;
(vi) etching the hard mask film, the anti-polish film, the buffer film, the gate electrode film and the gate oxide film using the patterned second photoresist as a mask;
(vii) removing the second photoresist
(viii) etching the semiconductor substrate using the patterned hard mask film as a mask, forming a plurality of trenches; and
(ix) forming isolation films within the trenches.

15. The method as claimed in claim 14, wherein the first photoresist is a photoresist for ArF that uses an ArF light source as an exposure light source.

16. The method as claimed in claim 14, wherein upon patterning of the hard mask film in the step (ii), a plasma etch process is employed.

17. The method as claimed in claim 16, wherein in the plasma etching process, HBr, $NF_3$, $Cl_2$, N2, $BCl_3$, $C_2F_6$, $CHF_3$, $CF_4$, $C_4F_6$, $C_5F_6$ or $C_4F_8$ is used as an etch gas.

18. The method as claimed in claim 14, wherein the hard mask film uses one of an oxide film, a oxynitride film, a nitride film and a polysilicon film.

19. The method as claimed in claim 14, wherein the second photoresist is a photoresist for KrF that uses a KrF light source as an exposure light source.

20. The method as claimed in claim 14, wherein in the etch process of the step (vi), the semiconductor substrate below the gate oxide film is additionally etched to a predetermined depth.

21. The method as claimed in claim 14, wherein upon etching of the semiconductor substrate in the step (viii), a plasma etch process is employed.

22. The method as claimed in claim 21 wherein in the plasma etching process, HBr, $NF_3$, $Cl_2$, N2, $BCl_3$, $C_2F_6$, $CHF_3$, $CF_4$, $C_4F_6$, $C_5F_6$ or $C_4F_8$ is used as an etch gas.

23. The method as claimed in claim 21, wherein the plasma etch process employs an ICP (Inductively Coupled Plasma) type plasma etch process.

24. The method as claimed in claim 21, wherein in the ICP type plasma etch process, source power is set to 0 to 500 [W], bias power is set to 0 to 2000 [W], and an etch gas employs $CF_4$, $CHF_3$, Ar, HBr or $O_2$.

25. The method as claimed in claim 14, wherein the step (ix) comprises:
forming an insulating film on the entire surface so that the trenches are buried; and
polishing the insulating film so that the anti-polish film is exposed.

* * * * *